United States Patent
Shaharabany et al.

(10) Patent No.: US 9,471,254 B2
(45) Date of Patent: Oct. 18, 2016

(54) STORAGE MODULE AND METHOD FOR ADAPTIVE BURST MODE

(71) Applicant: SanDisk Technologies Inc., Plano, TX (US)

(72) Inventors: Amir Shaharabany, Kochav Yair (IL); Tal Heller, Alonay Abba (IL); Hadas Oshinsky, Kfar Saba (IL); Enosh Levi, Sunnyvale, CA (US); Einav Pnina Zilberstein, Hod Hasharon (IL); Judah Gamliel Hahn, Ofra (IL)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/254,393

(22) Filed: Apr. 16, 2014

(65) Prior Publication Data

US 2015/0301763 A1     Oct. 22, 2015

(51) Int. Cl.
| | |
|---|---|
| G06F 12/00 | (2006.01) |
| G06F 3/06 | (2006.01) |
| G06F 13/28 | (2006.01) |
| G06F 12/02 | (2006.01) |

(52) U.S. Cl.
CPC ............ *G06F 3/0659* (2013.01); *G06F 3/0613* (2013.01); *G06F 3/0688* (2013.01); *G06F 13/28* (2013.01); *G06F 12/0253* (2013.01)

(58) Field of Classification Search
CPC .. G07F 7/1008; G06F 3/0679; G06F 3/0632; G06Q 20/341; G11C 5/04
USPC ......................................................... 711/115
See application file for complete search history.

(56) References Cited

U.S. PATENT DOCUMENTS

| | | | | |
|---|---|---|---|---|
| 5,948,081 | A * | 9/1999 | Foster | 710/40 |
| 6,615,308 | B1 * | 9/2003 | Fanning | 711/105 |
| 8,187,936 | B2 | 5/2012 | Alsmeier et al. | |
| 2003/0093633 | A1 * | 5/2003 | Thiesfeld et al. | 711/154 |
| 2006/0083069 | A1 * | 4/2006 | Fasoli | 365/185.19 |
| 2006/0123320 | A1 * | 6/2006 | Vogt | 714/762 |
| 2007/0016725 | A1 * | 1/2007 | Chu et al. | 711/113 |
| 2007/0055813 | A1 * | 3/2007 | Ingram et al. | 711/100 |
| 2008/0270678 | A1 | 10/2008 | Cornwell et al. | |
| 2009/0222639 | A1 * | 9/2009 | Hyvonen et al. | 711/170 |
| 2010/0118434 | A1 * | 5/2010 | Inoue | 360/75 |

(Continued)

FOREIGN PATENT DOCUMENTS

EP     0 374 764 A2     6/1990

OTHER PUBLICATIONS

Arya, P., "A Survey of 3D Nand Flash Memory", EECS Int'l Graduate Program, National Chiao Tung University, 2012, pp. 1-11.

(Continued)

*Primary Examiner* — Charles Rones
*Assistant Examiner* — Nanci Wong
(74) *Attorney, Agent, or Firm* — Brinks Gilson & Lione

(57) ABSTRACT

A storage module and method for adaptive burst mode are provided. In one embodiment, a storage module is provided comprising a memory and a controller. The controller is configured to receive a plurality of write commands from a host controller in communication with the storage module, store the plurality of write commands in a command queue in the storage module, and choose one of a plurality of burst modes in which to operate the memory based on how many write commands are stored in the command queue.

22 Claims, 7 Drawing Sheets

(56) References Cited

U.S. PATENT DOCUMENTS

| | | | |
|---|---|---|---|
| 2010/0191874 A1* | 7/2010 | Feeley et al. | 710/24 |
| 2010/0262766 A1 | 10/2010 | Sprinkle et al. | |
| 2010/0287217 A1 | 11/2010 | Borchers et al. | |
| 2012/0159051 A1 | 6/2012 | Hida et al. | |
| 2012/0254505 A1 | 10/2012 | Chishtie et al. | |
| 2012/0254966 A1* | 10/2012 | Parker | 726/7 |
| 2012/0311293 A1 | 12/2012 | Nemazie et al. | |
| 2013/0024641 A1 | 1/2013 | Talagala et al. | |
| 2013/0031307 A1 | 1/2013 | Itoh | |
| 2013/0054929 A1 | 2/2013 | Baik et al. | |
| 2013/0246582 A1* | 9/2013 | Lee | H04L 67/02 709/219 |
| 2013/0270643 A1* | 10/2013 | Lee et al. | 257/365 |
| 2013/0282955 A1 | 10/2013 | Parker et al. | |
| 2013/0305247 A1* | 11/2013 | Easton et al. | 718/1 |
| 2014/0122774 A1 | 5/2014 | Xian et al. | |

OTHER PUBLICATIONS

Nowak, E. et al., "Intrinsic Fluctuations in Vertical NAND Flash Memories", *2012 Symposium on VLSI Technology Digest of Technical Papers*, 2012, pp. 21-22.

Application as Filed for U.S. Appl. No. 13/829,010 entitled, "Storage Module and Method for Regulating Garbage Collection Operations based on Write Activity of a Host", filed on Mar. 14, 2013, 23 pages.

"Write Amplification", http://en.wikipedia.org/wiki/Write amplification, 13 pages printed Mar. 9, 2013.

Application as Filed for U.S. Appl. No. 14/133,979, filed on Dec. 19, 2013, 121 pages.

Application as Filed for U.S. Appl. No. 14/136,103, filed on Dec. 20, 2013, 56 pages.

Jang et al., "Vertical Cell Array using TCAT(Terabit Cell Array Transistor) Technology for Ultra High Density NAND Flash Memory," *2009 Symposium on VLSI Technology Digest of Technical Papers*, pp. 192-193, 2009.

Office Action for U.S. Appl. No. 13/829,010 dated Feb. 11, 2015, 19 pages.

Invitation to Pay Fees for PCT/US2015/023337 dated Jun. 8, 2015, 5 pages.

Office Action for U.S. Appl. No. 13/829,010 dated Jul. 15, 2015, 22 pages.

International Search Report and Written Opinion for PCT/US2015/023337 dated Aug. 18, 2015, 12 pages.

Office Action in U.S. Appl. No. 13/829,010 dated Jun. 17, 2016, 21 pages.

\* cited by examiner

STORAGE MODULE AND METHOD FOR ADAPTIVE BURST MODE

BACKGROUND

Storage modules may be used in different conditions, which place different performance requirements on the memory in the storage module. To account for these different conditions, memories in some storage devices can be operated in a "normal" mode or in a "burst" mode, in which a higher-than-average performance by the storage module is required to satisfy a higher-than-average number of write commands from a host controller. For example, when a storage module is part of a video camera device, raw video shot by the camera is stored in the camera's RAM, and then it is compressed and transferred to the memory in the storage module. In such systems, the memory is usually required to match the average rate of compressed video, and, as such, the burst mode may be needed to provide a write performance that matches the rate at which the video data is produced. For example, in some storage modules, the burst mode may be capable of supporting a storage rate of 160 MB/s for 4 GB, while the normal mode may support rates of up to 80 MB/s for 12 GB.

To achieve the higher-than-average performance, the storage module can store data in a single-level cell (SLC) partition instead of a multi-level cell (MLC) partition, as writing to SLC cells is faster than writing to MLC cells. Alternatively, instead of writing to a dedicated SLC partition, if the memory supports a dynamic configuration where a memory cell can be used either as an SLC cell or an MLC cell on demand, certain memory cells can be configured to be SLC cells during a burst mode. SLC mode is faster than MLC mode but consumes memory resources (i.e., the memory cells) at a rate that is at least twice the rate of MLC storage. Therefore, the capacity of a memory working in burst mode is smaller than the capacity of the memory working in non-burst mode, where MLC cells would be used. Moreover, in order to maximize the storage rate of a burst, the memory management software/firmware can be configured to avoid garbage collection operations during burst mode, as the number of memory cells available to store data is temporarily reduced during the garbage collection process. However, while maximizing instantaneous performance, avoiding garbage collection also reduces capacity, since at some point, the memory may exhaust all the existing free blocks and may have no additional available space for storing additional information.

OVERVIEW

Embodiments of the present invention are defined by the claims, and nothing in this section should be taken as a limitation on those claims.

By way of introduction, the below embodiments relate to storage module and method for adaptive burst mode. In one embodiment, a storage module is provided comprising a memory and a controller. The controller is configured to receive a plurality of write commands from a host controller in communication with the storage module, store the plurality of write commands in a command queue in the storage module, and choose one of a plurality of burst modes in which to operate the memory based on how many write commands are stored in the command queue.

Other embodiments are possible, and each of the embodiments can be used alone or together in combination. Accordingly, various embodiments will now be described with reference to the attached drawings.

DETAILED DESCRIPTION

As mentioned in the background section above, some storage modules can be operated in a "normal" mode or in a "burst" mode, in which a higher-than-average performance by the storage module is required to satisfy a higher-than-average number of write commands from a host controller. For example, in some storage modules, the burst mode may be capable of supporting a storage rate of 160 MB/s for 4 GB (i.e., for 10 seconds), while the normal mode may support rates of up to 80 MB/s for 12 GB. An application running on a host controller requiring a performance greater than 80 MB/s may cause the storage module to operate in burst mode, even though it does not require the full rate of 160 MB/s. Using the burst mode may lead to inefficient use of resources and may limit the capacity of the data handled by the application. For example, the application may be a video application running at a low resolution but for a long time. Using burst mode will unnecessarily limit the length of video clips than can be taken by the application, while the normal (sequential) mode does not support the required rate. The below embodiments provide an adaptive burst mode technique that can address this problem by providing a plurality of different burst modes that can be configured dynamically to allow the host application to receive its required resources and use them efficiently.

Before turning to these and other embodiments, the following paragraphs provide a discussion of an exemplary storage module that can be used with these embodiments. Of course, these are just examples, and other suitable types of storage modules can be used.

Figure 1:
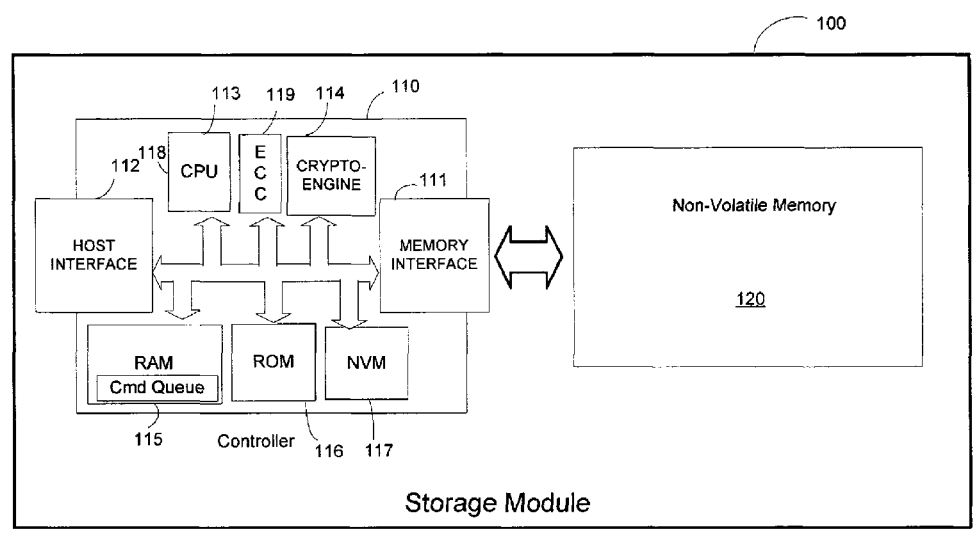
FIG. 1 is a block diagram of an exemplary storage module according to an embodiment.

As illustrated in FIG. 1, a storage module 100 of one embodiment comprises a storage controller 110 and non-volatile memory 120. The storage controller 110 comprises a memory interface 111 for interfacing with the non-volatile memory 120 and a host interface 112 for placing the storage module 100 operatively in communication with a host controller. As used herein, the phrase "operatively in communication with" could mean directly in communication with or indirectly in (wired or wireless) communication with through one or more components, which may or may not be shown or described herein.

Figure 2A:
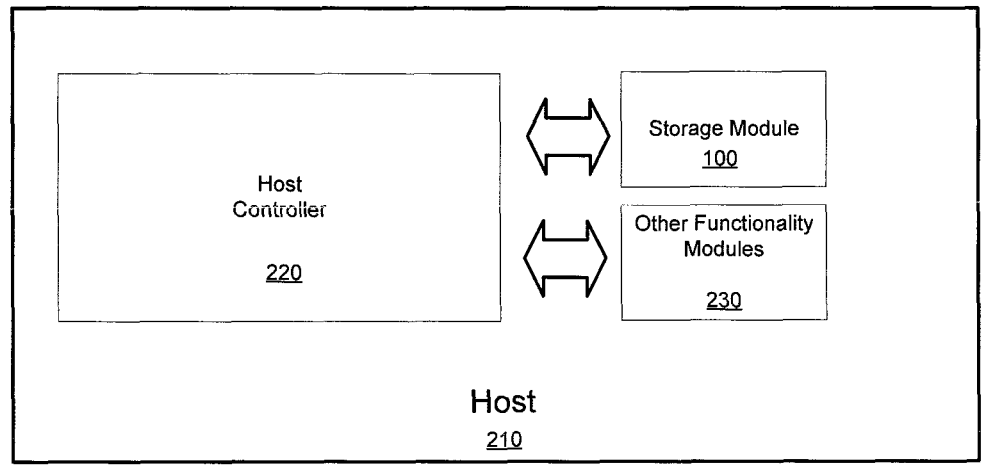
FIG. 2A is a block diagram of a host according to an embodiment, where the exemplary storage module of FIG. 1 is embedded in the host.

As shown in FIG. 2A, the storage module 100 can be embedded in a host 210 having a host controller 220. That is, the host 210 embodies the host controller 220 and the storage module 100, such that the host controller 220 interfaces with the embedded storage module 100 to manage its operations. For example, the storage module 100 can take the form of an iNAND™ eSD/eMMC embedded flash drive by SanDisk Corporation, or, more generally, any type of solid state drive (SSD), a hybrid storage device (having both a hard disk drive and a solid state drive), and a memory caching system. The host controller 220 can interface with the embedded storage module 100 using, for example, an eMMC host interface or a UFS interface. The host 210 can take any form, such as, but not limited to, a mobile phone, a tablet computer, a digital media player, a game device, a personal digital assistant (PDA), a mobile (e.g., notebook, laptop) personal computer (PC), or a book reader. As shown in FIG. 2A, the host 210 can include optional other functionality modules 230. For example, if the host 210 is a mobile phone, the other functionality modules 230 can include hardware and/or software components to make and place telephone calls. As another example, if the host 210 has network connectivity capabilities, the other functionality modules 230 can include a network interface. Of course, these are just some examples, and other implementations can be used. Also, the host 210 can include other components (e.g., an audio output, input-output ports, etc.) that are not shown in FIG. 2A to simplify the drawing. It should be noted that while the host controller 220 can control the storage module 100, the storage module 100 can have its own controller to control its internal memory operations.

Figure 2B:
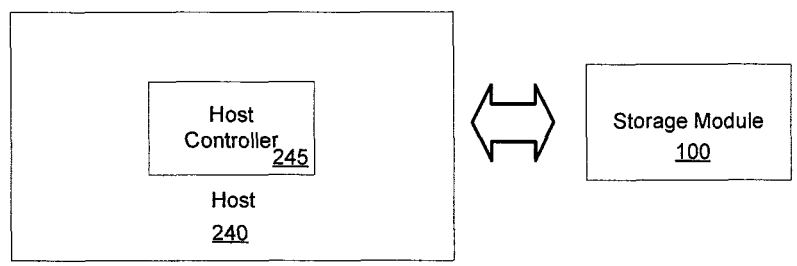
FIG. 2B is a block diagram of the exemplary storage module of FIG. 1 but where it is removably connected to a host.

As shown in FIG. 2B, instead of being an embedded device in a host, the storage module 100 can have physical and electrical connectors that allow the storage module 100 to be removably connected to a host 240 (having a host controller 245) via mating connectors. As such, the storage module 100 is a separate device from (and is not embedded in) the host 240. In this example, the storage module 100 can be a handheld, removable memory device, such as a Secure Digital (SD) memory card, a microSD memory card, a Compact Flash (CF) memory card, or a universal serial bus (USB) device (with a USB interface to the host), and the host 240 is a separate device, such as a mobile phone, a tablet computer, a digital media player, a game device, a personal digital assistant (PDA), a mobile (e.g., notebook, laptop) personal computer (PC), or a book reader, for example.

In FIGS. 2A and 2B, the storage module 100 is in communication with a host controller 220 or host 240 via the host interface 112 shown in FIG. 1. The host interface 112 can take any suitable form, such as, but not limited to, an eMMC host interface, a UFS interface, and a USB interface. The host interface 110 in the storage module 110 conveys memory management commands from the host controller 220 (FIG. 2A) or host 240 (FIG. 2B) to the storage controller 110, and also conveys memory responses from the storage controller 110 to the host controller 220 (FIG. 2A) or host 240 (FIG. 2B). Also, it should be noted that when the storage module 110 is embedded in the host 210, some or all of the functions described herein as being performed by the storage controller 110 in the storage module 100 can instead be performed by the host controller 220.

Returning to FIG. 1, the storage controller 110 comprises a central processing unit (CPU) 113, an optional hardware crypto-engine 114 operative to provide encryption and/or decryption operations, read access memory (RAM) 115, read only memory (ROM) 116 which can store firmware for the basic operations of the storage module 100, and a non-volatile memory (NVM) 117 which can store a device-specific key used for encryption/decryption operations, when used. As shown in FIG. 1, the RAM 115 stores a command queue, although, the command queue can be located in another location in the storage module 100. The storage controller 110 can be implemented in any suitable manner. For example, the storage controller 110 can take the form of a microprocessor or processor and a computer-readable medium that stores computer-readable program code (e.g., software or firmware) executable by the (micro) processor, logic gates, switches, an application specific integrated circuit (ASIC), a programmable logic controller, and an embedded microcontroller, for example. Suitable controllers can be obtained from SanDisk or other vendors. The storage controller 110 can be configured with hardware and/or software to perform the various functions described below and shown in the flow charts. Also, some of the components shown as being internal to the storage controller 110 can also be stored external to the storage controller 110, and other component can be used. For example, the RAM 115 (or an additional RAM unit) can be located outside of the controller die and used as a page buffer for data read from and/or to be written to the memory 120. The storage controller 110 also has an error correction code (ECC) engine 119 that can create ECC parity bits for data to be stored in the memory 120 and decode ECC parity bits for data read from the memory 120 in order to identify and/or correct errors in the data. The ECC engine 119 can also be used to detect errors in data transmitted to the storage controller 110 from the host controller.

The non-volatile memory 120 can also take any suitable form. For example, in one embodiment, the non-volatile memory 120 takes the form of a solid-state (e.g., NAND flash) memory and can be one-time programmable, few-time programmable, or many-time programmable. Also, the non-volatile memory 120 can be a two-dimensional memory or a three-dimensional memory. The non-volatile memory 120 can also use single-level cell (SLC), multiple-level cell (MLC), triple-level cell (TLC), or other memory technologies, now known or later developed.

Figure 3:
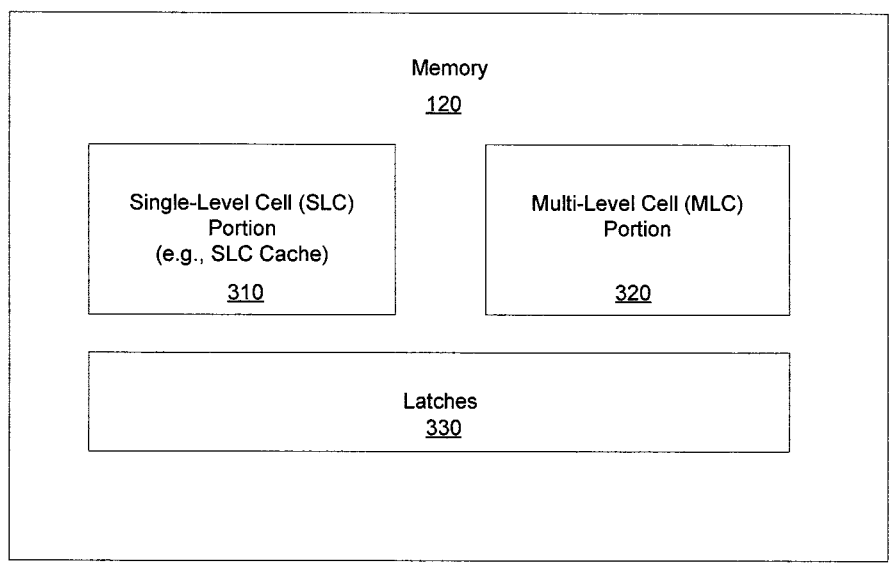
FIG. 3 is a block diagram of an exemplary storage module according to an embodiment.

As shown in FIG. 3, the memory 120 can be configured to have a SLC portion (partition) 310 and an MLC portion (partition) 320. In burst mode, the storage controller 110 can store data in the SLC portion 310 rather than the MLC portion 320, as writing to SLC cells is faster than writing to MLC cells. Later, after the burst mode is over, the data written to the SLC portion 310 can be written to the MLC portion 320 to increase the available storage capacity of the memory 120. In this way, the SLC portion 310 can be considered an "SLC cache." Instead of having separate SLC and MLC portions 310, 320, the memory 120 can be dynamically configured, where a memory cell can be used as an SLC cell or an MLC cell on demand. As also shown in FIG. 3, the memory 120 can have volatile latches 330, which store data from the storage controller 110 before it is written to the non-volatile memory cells, as well as data read from the non-volatile memory cells before the data is sent to the storage controller 110.

As mentioned in the background section above, some storage modules can be operated in a "normal" mode or in a "burst" mode, in which a higher-than-average performance by the storage module is required to satisfy a higher-than-average number of write commands from a host controller. However, only having these two modes can lead to inefficient use of resources and may limit the capacity of the data handled by the application. For example, in some storage modules, the burst mode may be capable of supporting a storage rate of 160 MB/s for 4 GB, while the normal mode may support rates of up to 80 MB/s for 12 GB. So, if an application running on a host controller requires a performance between 80 MB/s and 160 MB/s, the storage module would need to operate in burst mode, even though that mode may provide much greater performance (and consume more memory resources) than needed. Consider, for example, a video application that is shooting video at a resolution at 100 MB/s (i.e., between the tradition normal and burst mode performance rates of 80 MB/s and 160 MB/s) for a long time. The desired 100 MB/s resolution would dictate that the burst mode be used instead of the normal mode performance of 80 MB/s, even though the 160 MB/s performance of the burst mode would be more performance than is needed. Further, because memory capacity is limited to provide this performance (e.g., because SLC cells are used in burst mode instead of MLC cells), using the traditional burst mode in this example may cause the memory to run out of storage space. So, using the traditional burst mode in this example may unnecessarily limit the length of video clips to be taken by the application, while the normal (sequential) mode does not support the required rate.

To address this issue, in one embodiment, the storage controller 110 is configured to operate in one of a plurality of different burst modes that can differ from one another in one or more characteristics, resulting in various performance/capacity tradeoffs that can be dynamically chosen to fit a given host requirement. In this way, the storage module 100 can choose a burst mode that more closely fits the desired performance, thereby avoiding the excessive cost that is presented with the "take it or leave it" approach of current storage modules that only offer normal and burst modes. The plurality of burst modes can be discrete with a fixed number (e.g., five) of burst modes, or the plurality of burst modes can provide a continuous performance range. Either way, by providing a plurality of burst modes for the storage controller 110 to choose from, these embodiments can increase memory capacity and endurance without affecting the performance. When a host application would like to initiate with adaptive burst mode, it may send an indication to the storage controller 110 of its request for burst mode, while the exact performance level (i.e., the particular burst mode) may be determined by the storage controller 110.

The various burst modes can differ from one another in one or more characteristics. For example, the number of single level cells (SLC) versus multi-level cells (MLC) used in the different burst mode can vary. While writing to SLC cells is faster than writing to MLC cells, using SLC cells during a burst mode can provide high performance at the cost of more quickly consuming memory resources (e.g., at twice the rate). By setting the number of memory cells to operate in SLC mode, the storage controller 110 of this embodiment can match the performance requirements of the host application without sacrificing unnecessary capacity.

As another example, the number of garbage collection operations performed on the memory 120 during execution of a burst of write commands can vary among different burst modes. Garbage collection is a memory management process in which the storage controller 110 uses its idle time to consolidate blocks of memory before the host controller needs to write new data. In practice, the storage module 100 may receive an incoming command from the host controller when a garbage collection operation is in process. In such a situation, the garbage collection operation is typically interrupted in order to execute the incoming command with minimal degradation to the user experience. However, the fact that the storage module is occupied with system maintenance while an incoming command is received is, by itself, a cause for additional latency and degradation in the user experience. As a result, in the traditional burst mode, the storage controller avoids garbage collection operations during burst mode in order to maximize the storage rate of a burst. However, while maximizing instantaneous performance, avoiding garbage collection also reduces capacity, since at some point, the memory may exhaust all the existing free blocks and may have no additional available space for storing additional information. So, in one embodiment, one of the characteristics that can vary among different burst modes is the number of garbage collection operations performed on the memory 120 during the burst mode. This number can range from zero (thereby eliminating the risk of interruption) to some given number.

Another example of a characteristic that can vary among different burst modes is parameters used by the ECC engine 119 in performing error correction code operations during execution of a burst of write commands. ECC parameters include, but are not limited to, the number of parity bits used, the minimum Hamming distance used, and even whether or not ECC is used at all. The less-robust ECC parameters used, the higher the write performance. However, for applications that require a lower burst write performance but stronger data accuracy, the storage controller 110 can choose one of the burst modes that provides most robust ECC parameters.

Figure 4:
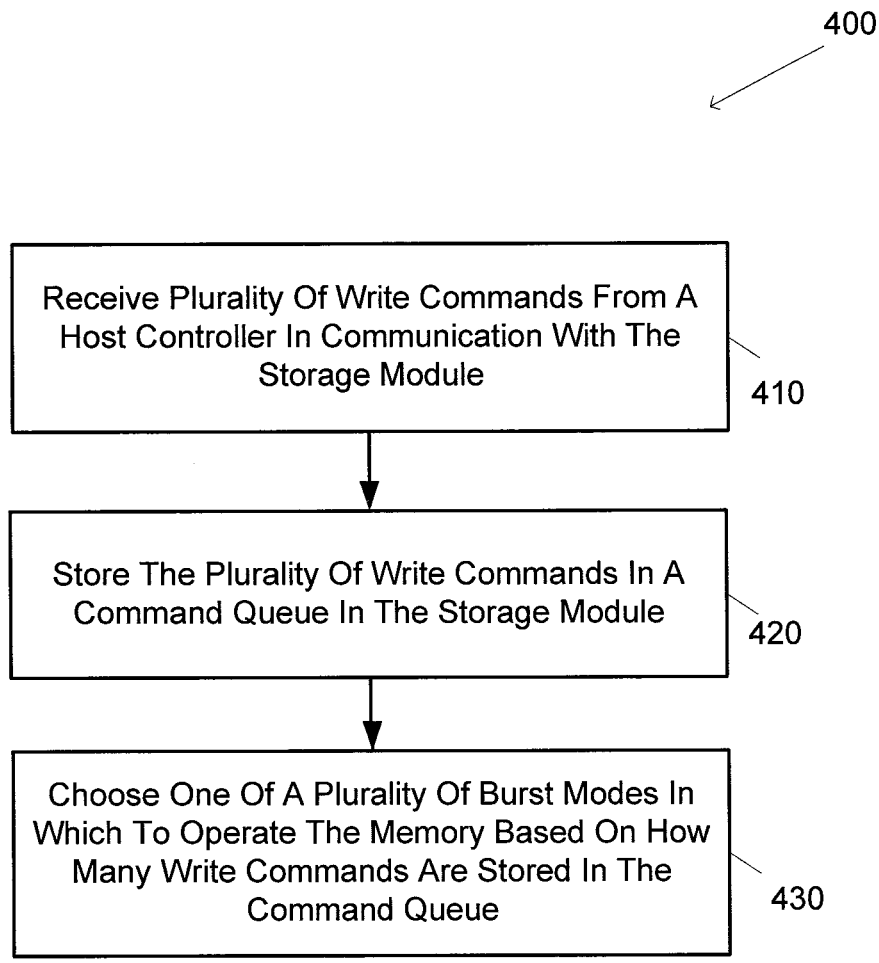
FIG. 4 is a flow chart of a method for adaptive burst mode according to an embodiment.

The storage controller 110 can determine which of the plurality of burst modes to use in any suitable way. In one embodiment, illustrated in the flow chart 400 of FIG. 4, the storage controller 110 receives a plurality of write commands from a host controller in communication with the storage module 100 (act 410). The storage controller 110 then stores the plurality of write commands in a command queue in the storage module 100 (act 420). The command queue can be in any suitable location in the storage module 100 (e.g., in the RAM 115 or NVM 117 in the storage controller 110, in the memory 120, or any other location in the storage module 100). The storage controller 110 then chooses one of a plurality of burst modes in which to operate the memory 120 based on how many write commands are stored in the command queue (act 430). In this way, the storage controller 110 chooses a burst mode depending on the fill-level of the command queue. So, if the command queue is very full, the storage controller 110 can choose a burst mode with a higher performance, whereas, if the command queue is not very full (but perhaps higher than some threshold amount above "normal"), the storage controller 110 can choose a less-aggressive burst mode that would provide greater memory capacity and/or data accuracy.

Figure 5:
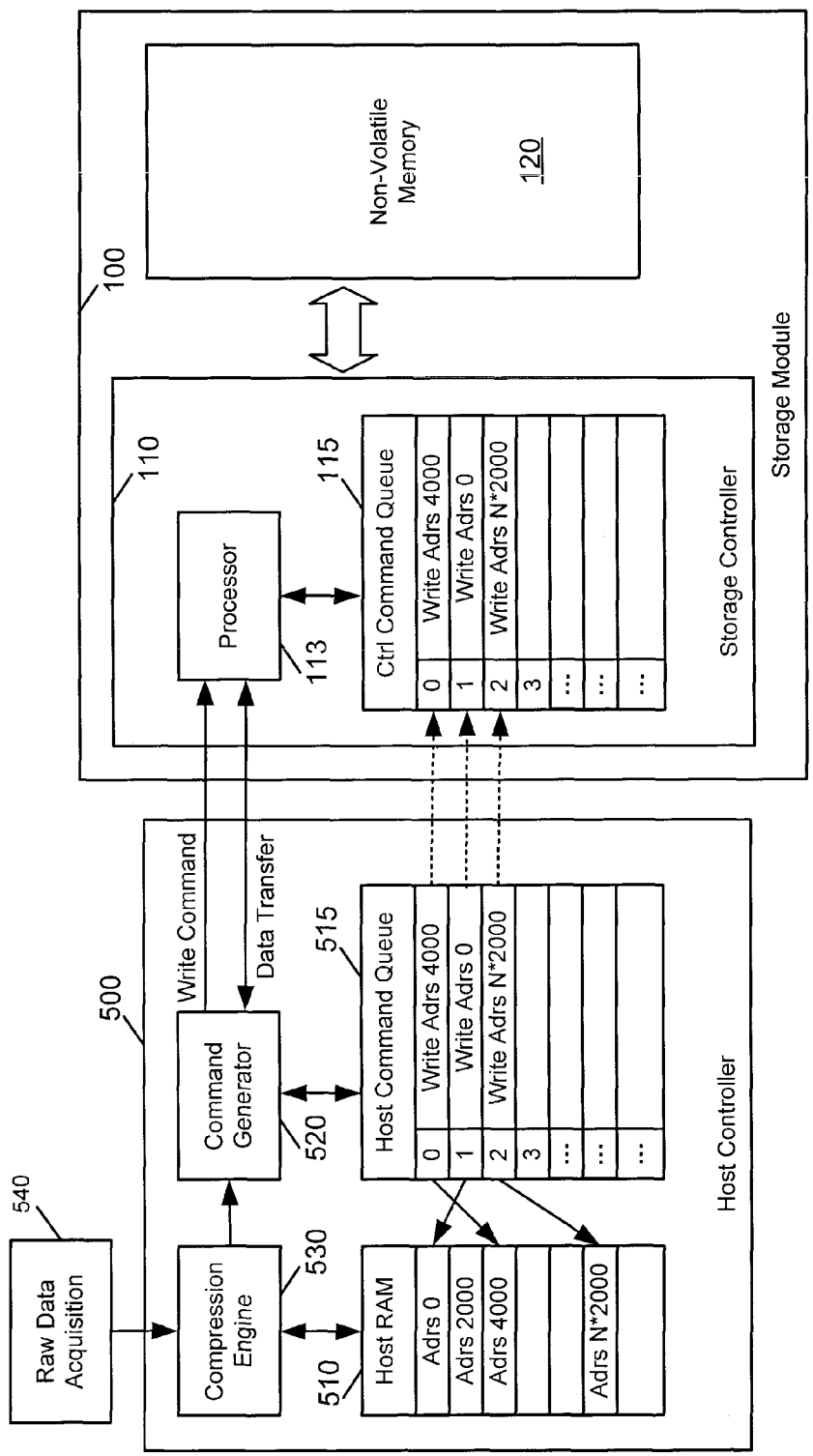
FIG. 5 is a block diagram of an exemplary storage module according to an embodiment.

Returning to the drawings, FIG. 5 is an example of one particular implementation of this embodiment. It should be understood that this is just one example, and the details of this example should not be read into the claims unless expressly recited therein. FIG. 5 shows a host controller 500 having RAM 510, a host command queue 515, a command generator 520, and a compression engine 530. In this example, the host controller 500 is part of a digital camera and receives raw data 540 acquired by the camera. (Some or all of these components can be located outside of the host controller 500 (e.g., in other locations in the host).) The storage module 100 has a storage controller 110 with a processor 113 and a command queue (here, stored in RAM 115), and the storage controller 110 is in operative communication with the memory 120. While only one command queue is shown in the host and storage controllers in this embodiment, as will be discussed below, multiple queues can be used.

In this embodiment, before commands from the host controller 500 are executed by the storage controller 110, the commands are stored in the command queue 115 in the storage controller 110, so the processor 113 in the storage controller 110 can determine which of a plurality of burst modes to use (e.g., based on the fill level of the command queue 115). In this particular embodiment, the command queue 115 in the storage controller 110 is a mirror of the command queue 515 in the host controller 500.

In operation, raw video shot by the camera is stored in the host's RAM 510 after being compressed by the compression engine 530. The command generator 520 generates write commands to write the data in the storage module 100 and stores these write commands in the host's command queue 515. In this embodiment, the commands in the command queue 515 may point to the host RAM 510, wherein each pointer is associated with a data chunk of a length that is a function of the resolution of the host RAM 510, where the data begins at the pointed address. Preferably, the command queue entries are enumerated in a sequence beginning with 0 (or 1) and incrementing by 1 between consecutive elements. The resolution of the host RAM 510 can be determined according to the depth of the host command queue 515. For example, if the host RAM 510 has 10 MB, and the host command queue 515 depth is 10, then the host RAM 510 may be partitioned into 10 data units of size 1 MB each. The command generator 520 can be configured to generate the write commands, associate each write command with its data in the host RAM 510, and communicate with the storage controller 110 regarding the write commands and their associated data. At the appropriate point, the host controller 500 sends the commands stored in the host's command queue 515 to the storage module 100 for storage in the storage controller's command queue 115 in order to create a mirror image of the host command queue 515 in the storage controller 110.

Figure 6:
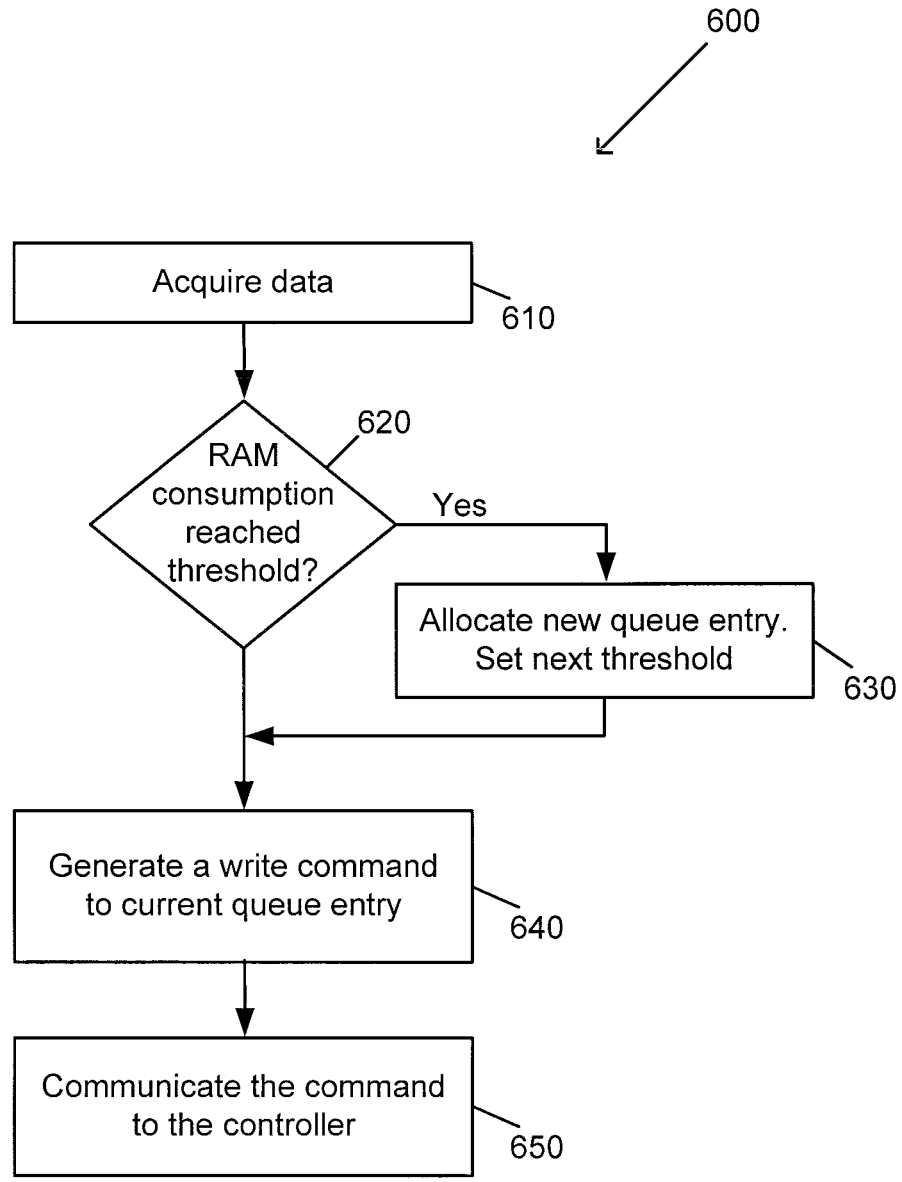
FIG. 6 is a flow chart of a method for adaptive burst mode according to an embodiment.

FIG. 6 is a flow chart 600 illustrating the operation of the host controller 500. First, the host controller 500 acquires the raw data 540 (act 610). After the data is compressed by the compression engine 530, the host controller 500 determines if the host RAM 510 consumption has reached a threshold (act 620). If it has, the host controller 500 allocated a new queue entry and sets the next threshold (act 630). The host controller 500 then stores the data in the host's RAM 510, and when a predefined amount of RAM 510 has been written, the command generator 515 generates a write command to an available entry in the command queue table (act 640). In this embodiment, each write command points to an address in the host RAM 510 that stores the data associated with that command. Finally, the host controller 500 communicates the command to the storage controller 115 to generate an image of the host command queue 515 in the storage controller 115 (act 630). This process is repeated for a plurality of write commands that make up the potential burst operation. So, the host application consumes host RAM 510 and triggers storage write commands, and when the host RAM 510 reaches a threshold, the next host write commands is applied to new queue entry. When the previous storage commands are executed, the host RAM 510 is free, and the consumption level threshold is set to previous level.

Figure 7:
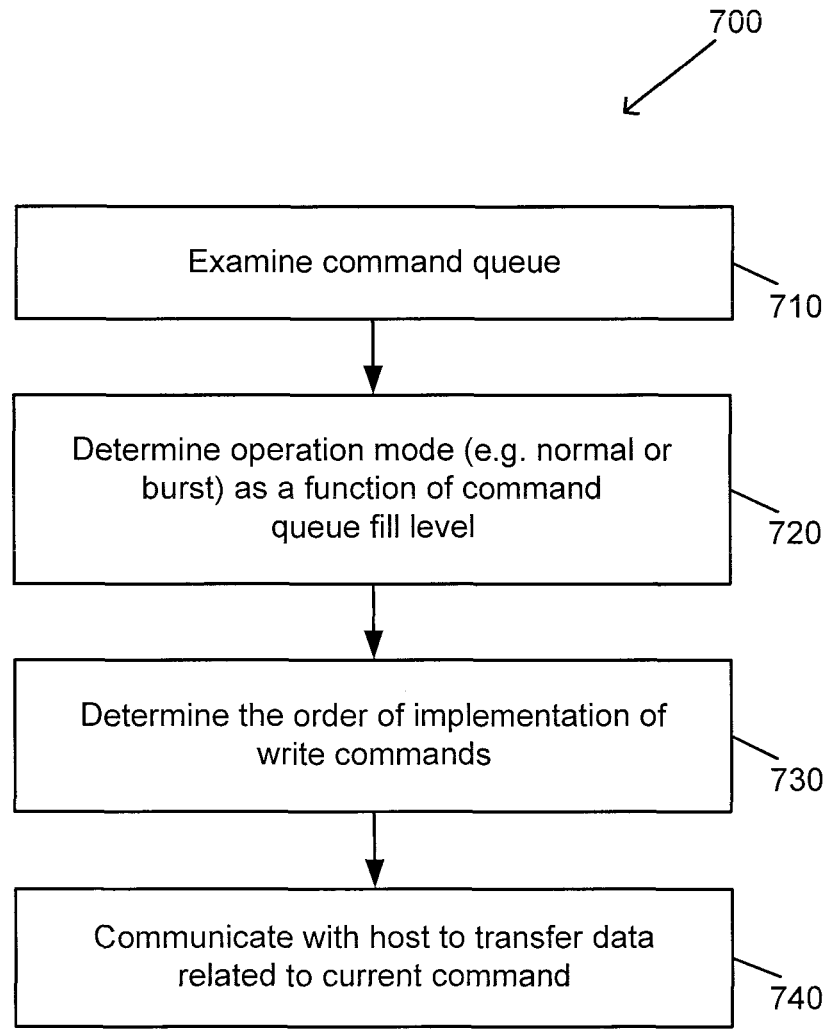
FIG. 7 is a flow chart of a method for adaptive burst mode according to an embodiment.

FIG. 7 is a flow chart 700 illustrating the operation of the storage controller 110. First, the storage controller 110 examines its command queue 115 (act 710) and determines which burst mode (if any, as a normal mode can be chosen) to operate in as a function of the fill level of the command queue 115 (act 720). In this way, the storage controller 110 chooses one of the plurality of burst modes based on the fill level of the command queue 115, such that the greater the fill level of the command queue 115, the greater the intensity of the burst mode. The storage controller 110 may estimate the required bandwidth for the host application according to the fill level of the host RAM 510, which is reflected in the command queue 115 fill level. For example whenever the host RAM 510 is more than half full, the storage controller 110 may decide to operate in a full burst mode, while if the host RAM 510 is only full up to a quarter of its capacity, the storage controller 110 may decide to operate in a burst mode with a lower bandwidth. As mentioned above, the difference between the burst modes may be just the bandwidth dedicated to the application, or other differences can be considered. For example, in an extreme burst mode, all data can be stored in SLC, while in more-relaxed burst modes, data can be stored part in SLC cells and part in MLC cells. Additionally or alternatively, in an extreme burst mode, only minimal garbage collection can be performed, while in relaxed-burst mode, a larger amount of garbage collection can be performed. Additionally or alternatively, in an extreme burst mode, the parameters of the ECC engine 119 may differ from the parameters in a more-relaxed burst mode.

Returning to FIG. 7, optionally, the storage controller 110 can determine the order in which to implement/execute the write commands and which data chunk to transfer from the host RAM 510 to the storage module 100 (act 730). Finally, the storage module 110 communicates with the host controller 500 to receive the data associated with the plurality of write commands that are to be executed (act 740). As mentioned above, in this embodiment, the commands in the host's command queue 515 point to the location in the host's RAM 510 that stores the data associated with the command. So, the commands that are sent to the storage controller 110 for storage in the command queue 115 do not contain the data to be written. In this embodiment, the storage controller 110 has the ability to choose when to transfer the data, such that resources may be allocated in the most efficient way. In this way, when receiving a request from the host controller 500 to work in adaptive burst mode, the storage controller 110 may decide what time slots would be used to transfer data from the host controller 500 in order to be able to provide the bandwidth required by the host controller 500. The storage controller 110 can allocate the time slots in a way that is compatible with the host application requirements but does not use the full capabilities of the burst mode. This will enable providing the host application with a sustainable performance for longer periods, with less stress on the memory 120.

There are many alternatives that can be used with these embodiments. For example, while the above embodiments described only one command queue in the storage module 100, in other embodiments, the storage module 100 comprises a plurality of command queues, and the storage controller 110 is further configured to determine which of the plurality of command queues to store a write command in. This alternative may be desired when using a flash storage interface that supports command queuing or multiply queues storages, such as the Universal Flash Storage (UFS) interface or the Embedded MultiMediaCard (eMMC) interface. With this alternative, the storage controller 110 can implement a queuing management technique, in which the storage controller 110 receives multiple commands, assigns the commands in a queue, and then performs the commands (at least partially) according to strategies that are set by the flash/queuing management technique.

In another alternative, the storage controller 110 is further configured to choose one of the plurality of burst modes based on a performance profile received from the host controller. The performance profile can be indicated by predefined flag(s) in a burst command and/or compressed data frame(s) written in predefined address(es) in the host RAM 510. When the storage controller 110 queries the host controller 500 for the location of data, the storage controller 110 can determine that data was written to the predefined addresses and then switch to a burst mode with the corresponding performance parameters as required by the host.

Also, as mentioned above, the storage controller 110 can decide between several pre-defined modes of operation, wherein each mode of operation has a different guaranteed transient rate and a different supported overall capacity, for example. Alternatively, the modes of operation may be continuous, such that the storage controller may choose the supported rate from a continuous range.

Finally, as mentioned above, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAT, memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method for adaptive burst mode, the method comprising:
    performing the following in a storage controller of a storage module having a memory in operative communication with the storage controller:
        receiving a plurality of write commands from a host in communication with the storage module, wherein the write commands contain pointers to locations in a host that store data to be written in the memory in response to the write commands;
        choosing one of a plurality of burst modes in which to operate the memory based on how many write commands are received from the host, wherein each burst mode supports a different data storage rate for storing data in the memory; and
        requesting data to be transferred from the locations in the host specified by the pointers to the storage module at a rate determined by the data storage rate of the chosen burst mode;
    wherein the memory comprises a silicon substrate and a plurality of memory cells forming at least two memory layers vertically disposed with respect to each other to form a monolithic three-dimensional structure, wherein at least one memory layer is vertically disposed with respect to the silicon substrate.

2. The method of claim 1, wherein the plurality of burst modes differ from one another in one or more characteristics, including: (a) a number of single level cells versus multi-level cells in the memory used to store data written by the plurality of write commands, (b) a number of garbage collection operations performed on the memory during execution of the plurality of write commands, and (c) parameters used in an error correction code operation performed during execution of the plurality of write commands.

3. The method of claim 1 further comprising determining an order in which to execute the plurality of write commands.

4. The method of claim 1, further comprising storing the plurality of write commands in a command queue in the storage module, wherein by storing the plurality of write commands in the command queue in the storage module, the storage controller creates a mirror image of a command queue in the host.

5. The method of claim 4, wherein the more write commands are stored in the command queue, the more intense of a burst mode is chosen by the storage controller.

6. The method of claim 1 further comprising choosing the one of the plurality of burst modes based on a performance profile received from the host.

7. The method of claim 6, wherein the performance profile is indicated by one or more of the indications, including: (a) a flag in a burst command and (b) a compressed data frame written to predefined address.

8. The method of claim 1, wherein the storage module comprises a plurality of command queues, and wherein the method further comprises determining which of the plurality of command queues to store a write command in.

9. The method of claim 1, wherein the storage controller is on the same substrate as the memory cells.

10. The method of claim 1, wherein the storage module is embedded in the host.

11. The method of claim 1, wherein the storage module is removably connectable to the host.

12. A storage module comprising:
    a memory;
    a storage controller in operative communication with the memory, wherein the storage controller is configured to:
        receive a plurality of write commands from a host in communication with the storage module, wherein the write commands contain pointers to locations in a host that store data to be written in the memory in response to the write commands;
        choose one of a plurality of burst modes in which to operate the memory based on how many write commands are received from the host, wherein each burst mode supports a different data storage rate for storing data in the memory; and
        request data to be transferred from the locations in the host specified by the pointers to the storage module at a rate determined by the data storage rate of the chosen burst mode;
    wherein the memory comprises a silicon substrate and a plurality of memory cells forming at least two memory layers vertically disposed with respect to each other to form a monolithic three-dimensional structure, wherein at least one memory layer is vertically disposed with respect to the silicon substrate.

13. The storage module of claim 12, wherein the plurality of burst modes differ from one another in one or more characteristics, including: (a) a number of single level cells versus multi-level cells in the memory used to store data written by the plurality of write commands, (b) a number of garbage collection operations performed on the memory during execution of the plurality of write commands, and (c) parameters used in an error correction code operation performed during execution of the plurality of write commands.

14. The storage module of claim 12, wherein the storage controller is further configured to determine an order in which to execute the plurality of write commands.

15. The storage module of claim 12, wherein the storage controller is further configured to store the plurality of write commands in a command queue in the storage module, and wherein by storing the plurality of write commands in the command queue in the storage module, the storage controller creates a mirror image of a command queue in the host.

16. The storage module of claim 15, wherein the more write commands are stored in the command queue, the more intense of a burst mode is chosen by the storage controller.

17. The storage module of claim 12, wherein the storage controller is further configured to choose the one of the plurality of burst modes based on a performance profile received from the host controller.

18. The storage module of claim 17, wherein the performance profile is indicated by one or more indications, including: (a) a flag in a burst command and (b) a compressed data frame written to predefined address.

19. The storage module of claim 12, wherein the storage module comprises a plurality of command queues, and wherein the storage controller is further configured to determine which of the plurality of command queues to store a write command in.

20. The storage module of claim 12, wherein the storage controller is on the same substrate as the memory cells.

21. The storage module of claim 12, wherein the storage module is embedded in the host.

22. The storage module of claim 12, wherein the storage module is removably connectable to the host.

* * * * *